United States Patent
Chan et al.

(10) Patent No.: US 7,023,042 B2
(45) Date of Patent: Apr. 4, 2006

(54) METHOD OF FORMING A STACKED CAPACITOR STRUCTURE WITH INCREASED SURFACE AREA FOR A DRAM DEVICE

(75) Inventors: Bor-Wen Chan, Hsin-Chu (TW); Huan-Just Lin, Hsin-Chu (TW); Hun-Jan Tao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/755,498

(22) Filed: Jan. 12, 2004

(65) Prior Publication Data

US 2004/0142531 A1    Jul. 22, 2004

Related U.S. Application Data

(63) Continuation of application No. 10/054,561, filed on Jan. 22, 2002, now Pat. No. 6,706,591.

(51) Int. Cl.
*H01L 27/108* (2006.01)
*H01L 29/76* (2006.01)
*H01L 29/94* (2006.01)
*H01L 31/119* (2006.01)

(52) U.S. Cl. ............... 257/303; 257/306; 257/309; 438/396; 438/397; 438/398

(58) Field of Classification Search ........ 438/393–399, 438/706, 719, 720

See application file for complete search history.

(56) References Cited

U.S. PATENT DOCUMENTS

| | | | | |
|---|---|---|---|---|
| 5,670,405 | A | | 9/1997 | Tseng ..................... 437/52 |
| 5,691,221 | A | | 11/1997 | Jun ........................ 437/52 |
| 5,801,089 | A | | 9/1998 | Kenney ................... 438/589 |
| 5,923,989 | A | | 7/1999 | Lin et al. ................ 438/398 |
| 6,025,225 | A | | 2/2000 | Forbes et al. ........... 438/243 |
| 6,057,205 | A | | 5/2000 | Wu ....................... 438/398 |
| 6,103,571 | A | * | 8/2000 | Li et al. ................. 438/255 |
| 6,165,830 | A | * | 12/2000 | Lin et al. ............... 438/238 |
| 6,180,449 | B1 | * | 1/2001 | Iyer et al. .............. 438/253 |
| 6,294,420 | B1 | * | 9/2001 | Tsu et al. ............... 438/239 |
| 6,417,066 | B1 | * | 7/2002 | Lou ...................... 438/396 |
| 6,432,795 | B1 | * | 8/2002 | Lee ....................... 438/398 |
| 6,534,815 | B1 | * | 3/2003 | Yamamoto ............... 257/309 |
| 6,548,348 | B1 | * | 4/2003 | Ni et al. ................ 438/253 |
| 6,706,591 | B1 | * | 3/2004 | Chan et al. ............. 438/255 |

* cited by examiner

*Primary Examiner*—Duy-Vu N. Deo
(74) *Attorney, Agent, or Firm*—Haynes and Boone, LLP

(57) ABSTRACT

A process for forming a DRAM stacked capacitor structure with increased surface area, has been developed. The process features forming lateral grooves in the sides of a polysilicon storage node structure, during a dry etching procedure used to define the storage node structure. The grooves are selectively, and laterally formed in ion implanted veins, which in turn had been placed at various depths in an intrinsic polysilicon layer via a series of ion implantation steps, each performed at a specific implant energy. An isotopic component of the storage node structure, defining dry etch procedure, selectively etches the highly doped, ion implanted veins at a greater rate than the non-ion implanted regions of polysificon, located between the ion implanted veins, resulting in a necked profile, storage node structure, featuring increased surface area as a result of the formation of the lateral grooves.

8 Claims, 4 Drawing Sheets

METHOD OF FORMING A STACKED CAPACITOR STRUCTURE WITH INCREASED SURFACE AREA FOR A DRAM DEVICE

This is a Continuation of patent application Ser. No. 10/054,561, filling date Jan. 22, 2002, now U.S. Pat. No. 6,706,591, Method of Forming a Stacked Capacitor Structure with Increased Surface Area for a Dram Device, assigned to the same assignee as the present invention.

BACKGROUND OF THE INVENTION

(1) Field of the Invention

The present invention relates to methods used to fabricate semiconductor devices, and more specifically to a method used to form a stacked capacitor structure, with increased surface area, for a dynamic random access memory (DRAM) device.

(2) Description of Prior Art

Micro-miniaturization, or the ability to fabricate semiconductor devices using sub-micron features, have allowed the performance of these semiconductor devices to be improved while still decreasing the processing cost of a specific sub-micron device. Dimension reduction, realized via the use of sub-micron features, has resulted in decreases in performance degrading parasitic capacitances. In addition the use of sub-micron features have resulted in a greater number of smaller semiconductor chips attainable from a specific size starting substrate, with device densities of the smaller semiconductor chips still equal to or greater than counterpart larger semiconductor chips fabricated using larger dimensions, thus allowing the processing cost for a specific semiconductor chip to be reduced. However in the area of DRAM technology, the decreasing size of the transfer gate transistor limits the horizontal dimension of an overlying DRAM capacitor structure. To continually increase device performance capacitance increases, or increases in the surface area of the capacitor structure, have to be achieved, however without increasing the horizontal dimension of the capacitor structure. The increased surface area for DRAM stacked capacitor structures, are usually achieved via unique geometric configurations such as crown, cylindrical or fin shaped structures in which additional vertical features are formed as part of the stacked capacitor structure. However to achieve these unique configurations rigorous and complex process sequences are needed, adding additional process cost.

This invention will teach a method of forming a stacked capacitor structure, offering increased surface area, however without forming the complex vertical and protruding horizontal features comprised in the crown, cylindrical or fin type structure. This invention will feature a "necked" profile for a capacitor structure, comprised with necked regions, or lateral grooves located in, and extending from, the sides of capacitor storage node structure. The necked capacitor profile, obtained via multiple ion implantation procedures into, and conventional dry etching of, a storage node structure, can result in a capacitor structure exhibiting a surface area of about 3 times greater than a surface area achieved with flat surfaces. Prior art, such as Forbes et al, in U.S. Pat. No. 6,025,225, describe a method of roughening the surface of a trench capacitor structure, while Jun in U.S. Pat. No. 5,691,221, describe a method of forming a fin type, stacked capacitor structure. However neither of these prior arts describe a process for forming the novel, capacitor structure, featuring the necked profile, now described in this present invention.

SUMMARY OF THE INVENTION

It is an object of this invention to fabricate a DRAM device, on a semiconductor substrate.

It is another object of this invention to form a DRAM stacked capacitor structure, featuring a storage node structure with a necked profile, employed to increase the capacitor surface area.

It is still another object of this invention to form the necked profile, for the DRAM capacitor structure, via multiple ion implantation procedures, performed at various energies, placing groups of implanted ions at specific depths in a polysilicon storage node structure, followed by a dry etch procedure which laterally removes the implanted regions at a greater rate than the non-implanted regions of the storage node structure, resulting in the desired grooves, or the necked profile, for the polysilicon storage node structure of the DRAM capacitor device.

In accordance with the present invention a method of fabricating a DRAM capacitor structure, comprised with a storage node structure featuring a necked profile, used for surface area increases, is described. After formation of an underlying transfer gate transistor, a storage node plug structure is formed in an insulator layer, overlying and contacting a portion of a top surface of the transfer gate transistor source/drain region. An intrinsic polysilicon layer is deposited on the top surface of the insulator layer, overlying and contacting the top surface of the storage node plug structure. A series of ion implantation procedures is performed at multiple implant energies, placing layers of implanted ions in specific regions of the intrinsic polysilicon layer, with intrinsic, or non-implanted regions of polysilicon located between the implanted regions. A dry etch procedure is used to vertically define the polysilicon storage node structure, with the dry etch procedure also laterally, and selectively removing portions of the implanted regions located at the outside surface of the defined storage node structure, resulting in the necked profile storage node structure. After deposition of a capacitor dielectric layer on the necked profile, storage node structure, an upper electrode is formed resulting in a DRAM capacitor structure featuring increased surface area as a result of formation of the storage node structure with the necked profile.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
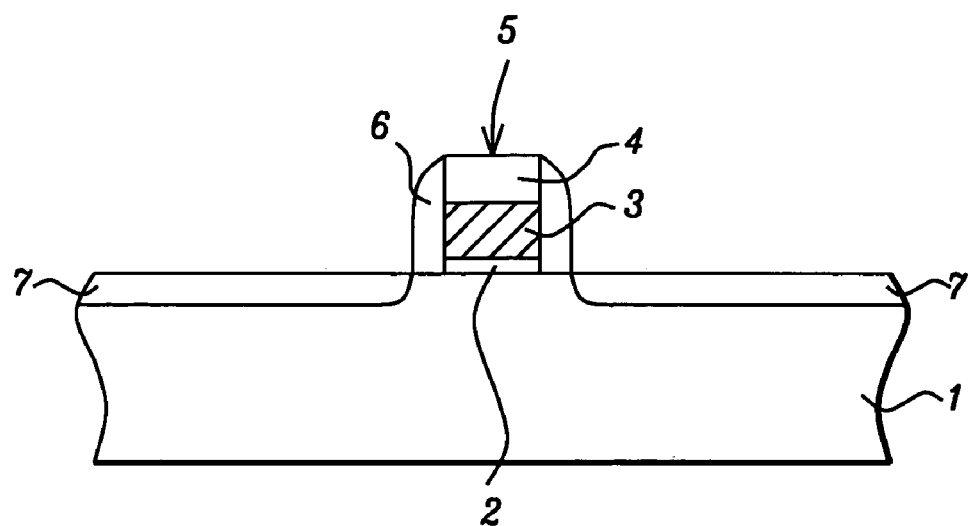
FIGS. 1–6, which schematically, in cross sectional style, describe key stages of fabrication used to fabricate a DRAM capacitor structure, featuring a storage node structure formed with a necked profile, designed to increase capacitor surface area.

The method of fabricating a DRAM capacitor structure, featuring a storage node structure formed with a necked profile, designed to increase capacitor surface area, will now be described in detail. Semiconductor substrate 1, comprised of P type, single crystalline silicon, featuring a <100> crystallographic orientation, is used and schematically shown in FIG. 1. Silicon dioxide gate insulator layer 2, is thermally grown to a thickness between about 15 to 100 Angstroms, followed by the formation of silicon nitride capped, polycide gate structure 5. Polycide layer 3, is comprised of an overlying metal silicide layer such as tungsten silicide, and an underlying, in situ doped, polysilicon layer 3. The underlying polysilicon layer is obtained via low pressure chemical vapor deposition (LPCVD), procedures, at a thickness between about 200 to 2000 Angstroms, and doped during deposition via the addition of arsine, or phosphine, to a silane ambient. The overlying tungsten silicide layer is also obtained via LPCVD procedures, at a thickness between about 200 to 2000 Angstroms, using silane and tungsten hexafluoride as reactants. Silicon nitride layer 4, is then deposited at a thickness between about 100 to 1000 Angstroms, via LPCVD or plasma enhanced chemical vapor deposition (PECVD) procedures. A photoresist shape, not shown in the drawings, is used as an mask to allow an anisotropic, reactive ion etching (RIE) procedure, using $Cl_2$ as an etchant, to define silicon nitride capped, polycide gate structure 5, shown schematically in FIG. 1. The width of silicon nitride capped, polycide gate structure 5, is between about 100 to 1000 Angstroms.

After removal of the photoresist shape used for definition of the silicon nitride capped, polycide gate structure, via plasma oxygen ashing procedures, insulator spacers 6, on formed on the sides of silicon nitride capped, polycide gate structure 5. This is accomplished via deposition of a silicon nitride, or a silicon oxide layer, via LPCVD or PECVD procedures, at a thickness between about 100 to 1500 Angstroms. An anisotropic RIE procedure, using $CF_4$ as an etchant is next used to form silicon nitride, or silicon oxide spacers on the sides of silicon nitride capped, polycide gate structure 5. Arsenic or phosphorous ions are next implanted into a region of semiconductor substrate 1, not covered by silicon nitride capped, polycide gate structure 5, or by insulator spacers 6, at an energy between about 2 to 100 KeV, at a dose between about 2E13 to 7E14 atoms/cm$^2$. An anneal procedure is next performed using either conventional furnace or rapid thermal anneal procedures, to activate the implanted ions, forming N type source/drain region 7, shown schematically in FIG. 1. Although this invention is described for a N channel device, it can also be applied to a P channel device.

Figure 2:
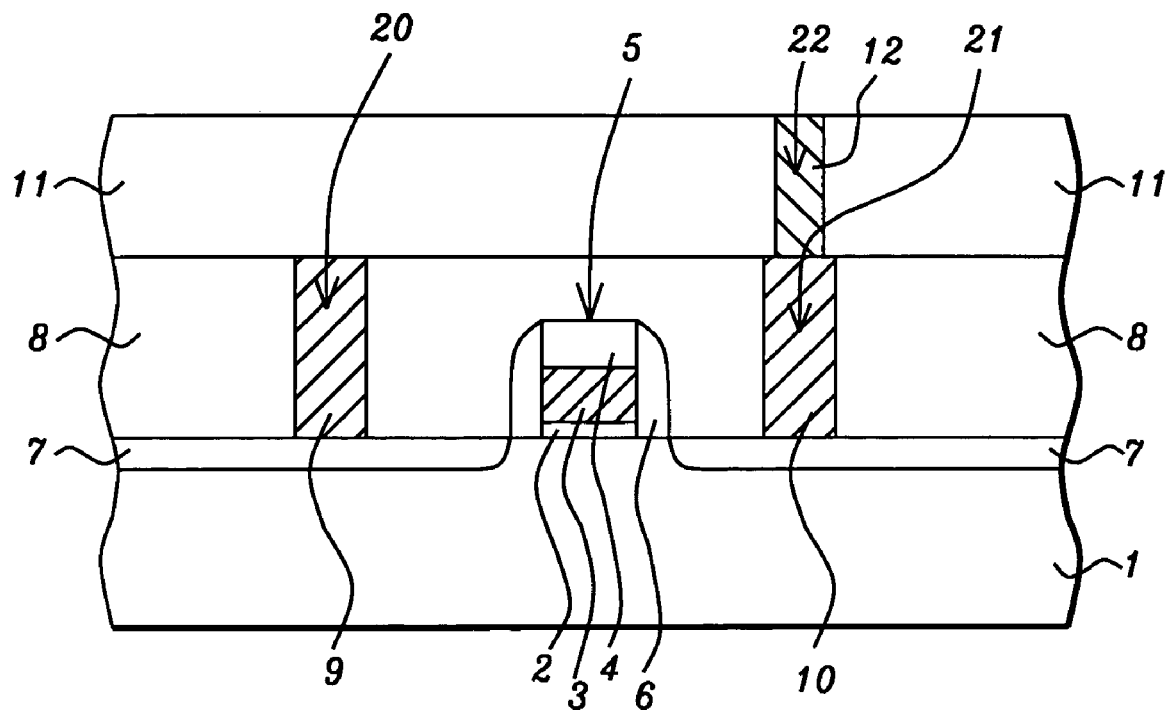

Insulator layer 8, such as silicon oxide, or boro-phosphosilicate glass (BPSG), is next deposited at a thickness between about 3000 to 12000 Angstroms, via LPCVD or PECVD procedures. Planarization of insulator layer 8, is then accomplished via a chemical mechanical polishing (CMP) procedure, resulting in a smooth top surface topography for insulator layer 8. Photolithographic and anisotropic RIE procedures, using $CHF_3$ as an etchant, are used to define openings 20, and 21, in insulator layer 8, each now exposing a top portion of source/drain region 7. After removal of the photoresist shape used to define openings 20, and 21, via plasma oxygen ashing procedures, a polysilicon layer is deposited via LPCVD procedures, at a thickness between about 3000 to 12000 Angstroms, completely filling openings 20, and 21. The polysilicon layer is doped in situ during deposition, via the addition of arsine, or phosphine to a silane ambient. Regions of unwanted polysilicon, located on the top surface of insulator layer 8, are then removed via CMP procedures, or via a selective RIE procedure using $Cl_2$ or $SF_6$ as an etchant, defining lower polysilicon storage node plug structure 10, in opening 21, and polysilicon bit line plug structure 9, located in opening 20. Insulator layer 11, again comprised of either silicon oxide, or BPSG, is next deposited via LPCVD or PECVD procedures, at a thickness between about 3000 to 12000 Angstroms, followed by photolithographic and anisotropic RIE procedures, using $CHF_3$ as an etchant, resulting in the definition of opening 22, exposing a portion of the top surface of lower polysilicon storage node plug structure 10. After removal of the photoresist shape used to define opening 22, another N type, in situ doped polysilicon layer is deposited via LPCVD procedures, at a thickness between about 1000 to 7000 Angstroms, completely filling opening 22. Removal of unwanted portions of the polysilicon layer is next accomplished via CMP or selective RIE procedures, resulting in the formation of upper polysilicon storage node plug structure 12, located in opening 22, overlying and contacting a portion of the top surface of lower polysilicon storage node plug structure 10. The result of these procedures is schematically shown in FIG. 2.

Figure 3:
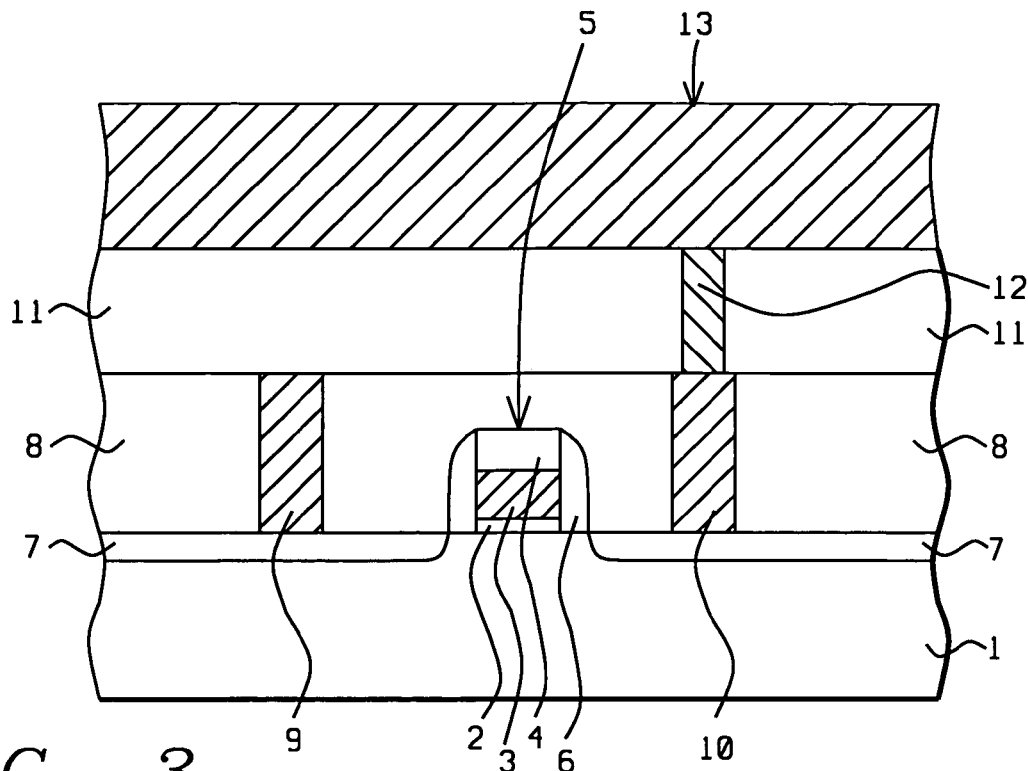
Figure 4:
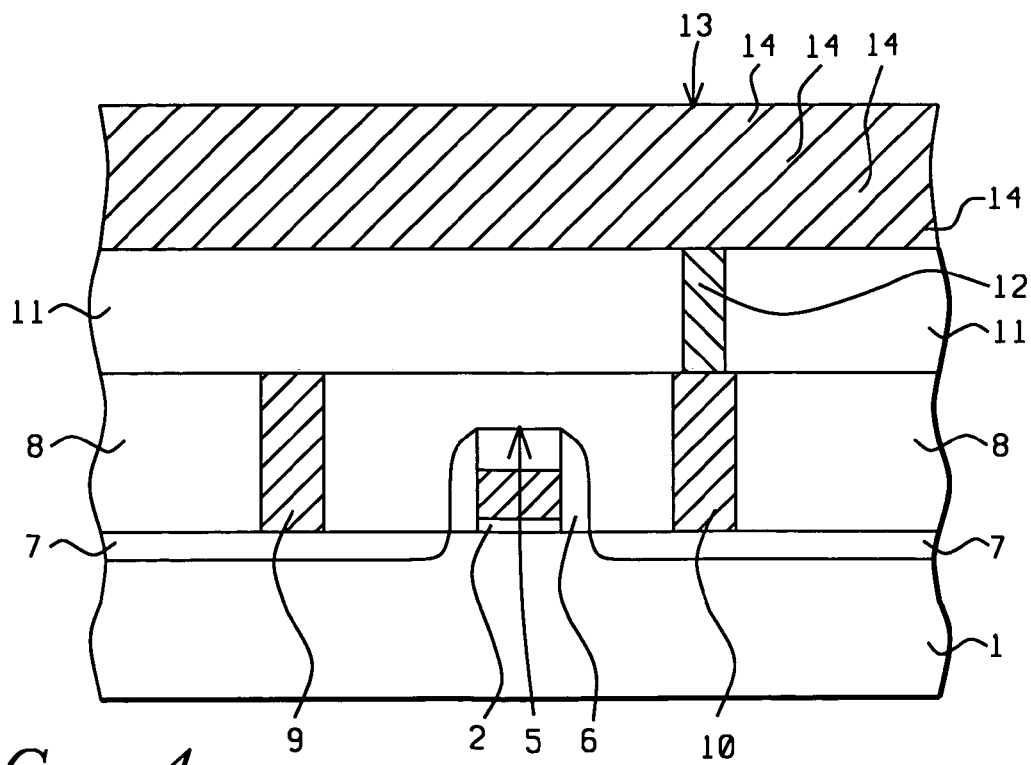

Intrinsically doped, polysilicon layer 13, shown schematically in FIG. 3, is next deposited via LPCVD procedures, at a thickness between about 3000 to 12000 Angstroms. A critical ion implantation procedure is next employed to form multiple veins of implanted ions, with each specific vein of implanted ions placed at a specific depth in intrinsic polysilicon layer 13. The veins of implanted ions, labelled 14, and schematically shown in FIG. 4, are achieved via multiple, blanket implantation procedures, using either arsenic or phosphorous ions. The number of specific ion implanted veins, can be between about 3 to 10, with the deepest vein created via implantation at an energy between about 50 to 100 KeV, while the shallowest, or the vein closest to the top surface of polysilicon layer 13, accomplished at an implantation energy between about 2 to 50 KeV. The veins of implanted ions, located between the deepest and shallowest veins, are obtained at energies between about 30 to 80 KeV. The implant dose for each of implanted veins 14, is between about 2E13 to 7E17 atoms/cm$^2$, while the intrinsic, or non-implanted space between implanted vein region, in polysilicon layer 13, is between about 100 to 5000 Angstroms. An anneal cycle can now be employed to activate the implanted ions.

Figure 5:
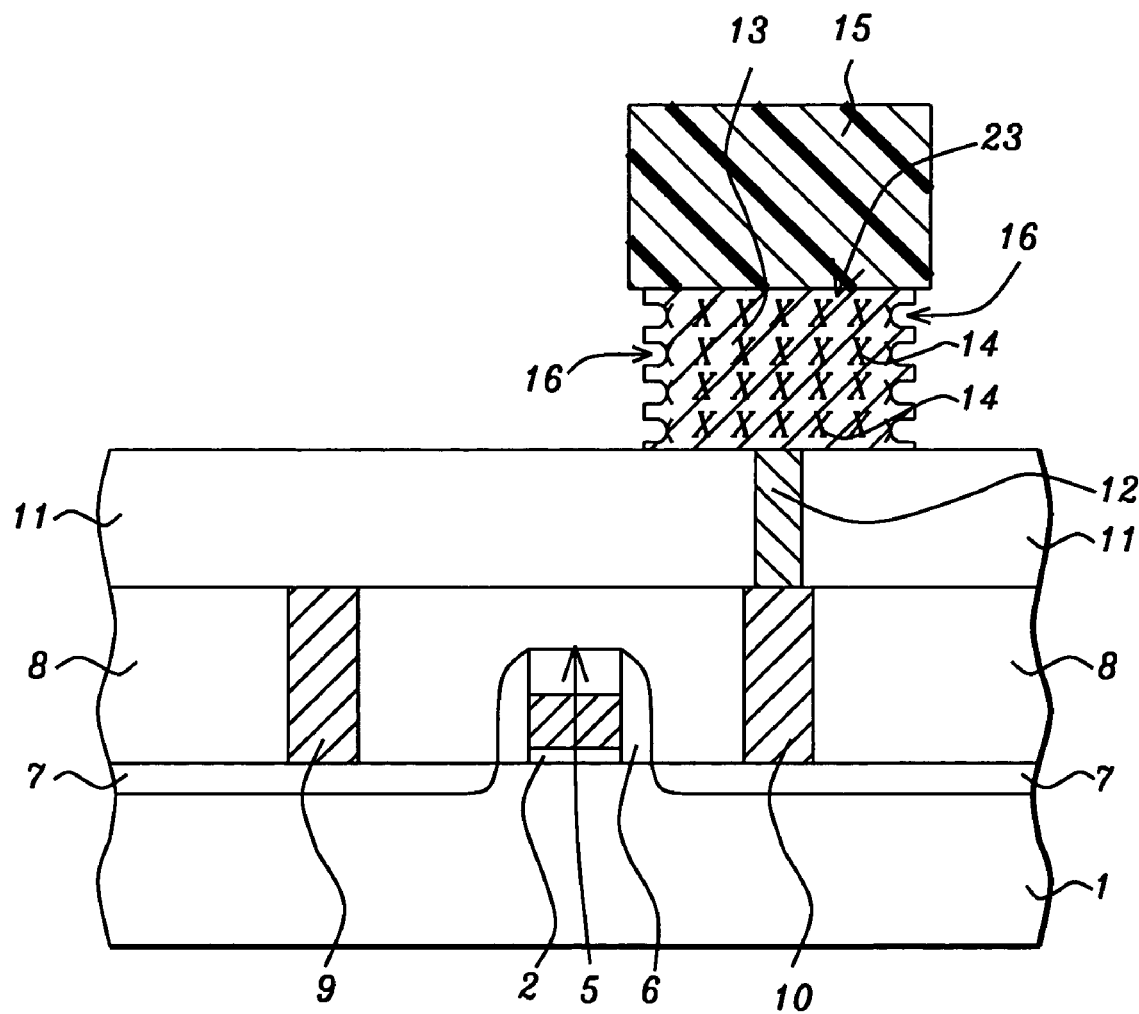

The formation of storage node structure 23, featuring a necked profile, is next addressed and schematically shown in FIG. 5. Photoresist shape 15, is formed on the top surface of polysilicon layer 13, and used as a etch mask to define storage node structure 23. A critical dry etch procedure, performed at specific conditions, is next employed to etch polysilicon layer 13, featuring an etch rate for portions of polysilicon comprised with ion implanted veins 14, greater than the etch rate for intrinsic regions of polysilicon, located between ion implanted veins 14. The dry etch procedure is performed using an inductive coupled plasma (ICP) procedure and tool, at a power for the top plate of the ICP tool between about 100 to 1000 watts, while a power between about 30 to 300 watts is used for the bottom plate. A pressure between about 4 to 50 mtorr, is employed, using an ambient comprised of $Cl_2$, HBr, and He as an etchant. These conditions result in a removal rate of intrinsic polysilicon of between about 600 to 1000 Angstroms/min, while the removal rate of polysilicon comprised with ion implanted veins 14, is greater, between about 1000 to 2000 Angstroms/min. In addition the dry etch conditions, specifically pressure, allow an isotropic component to be present, which in combination with the higher removal rate of implanted ions veins 14, result in a greater degree of lateral etching for implanted ion vein region, when compared to the smaller level of lateral etching experienced by the intrinsic polysilicon regions, thus resulting in the formation of lateral grooves 16, in ion implanted veins 14. The extent of lateral etching, or the lateral dimension of grooves 16, is between about 50 to 500 Angstroms, creating the necked profile for storage node structure 23. The increase in surface area for storage node structure 23, is between 2 to 4 times greater than counterpart storage node structures formed without notching.

Figure 6:
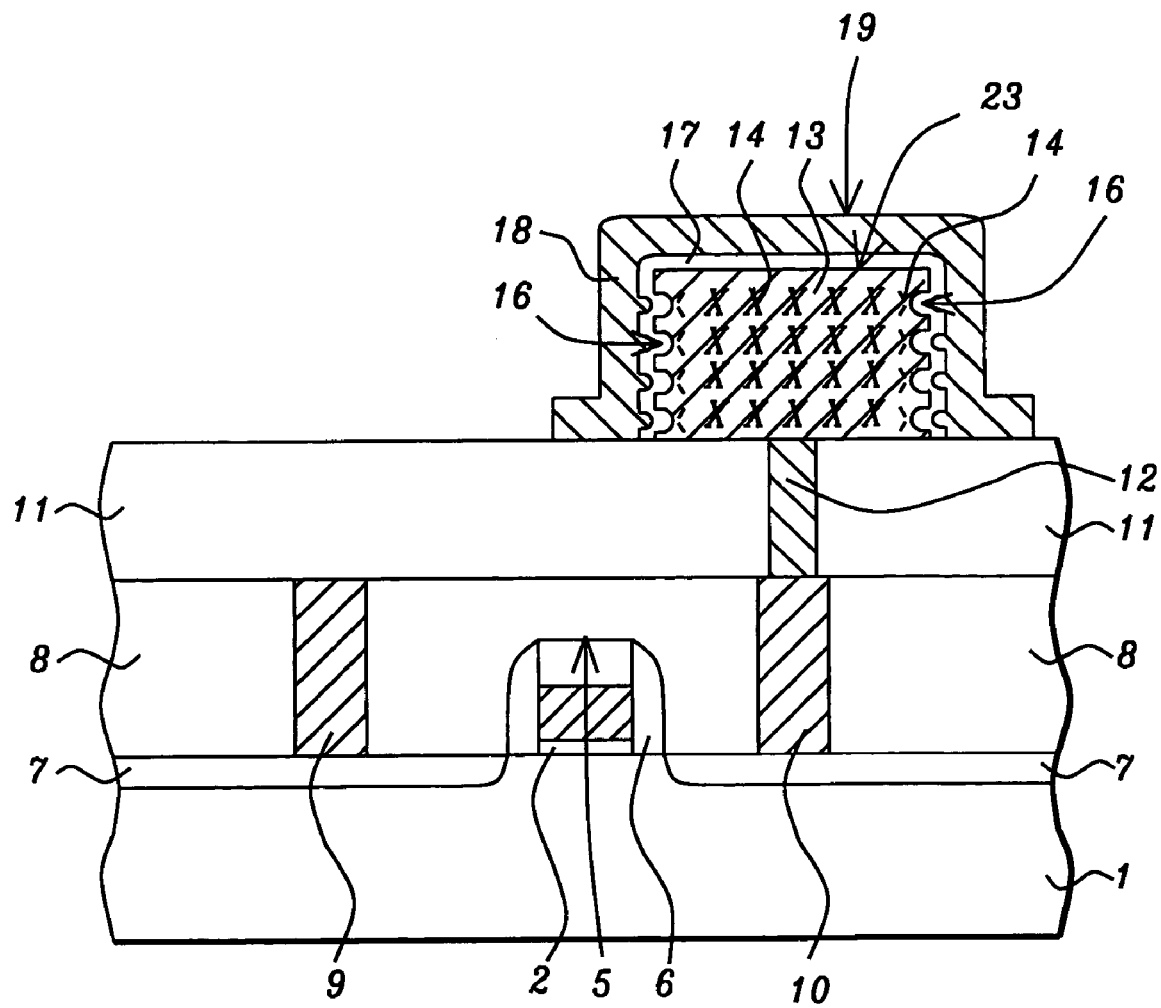

The completion of DRAM capacitor structure 19, featuring storage node structure 23, with the desired necked profile, is next addressed and schematically shown in FIG. 6. After removal of photoresist shape 15, via plasma oxygen ashing, capacitor dielectric layer 17, is formed on the necked profile surface of storage node structure 23. Capacitor dielectric layer 17, can be a tantalum oxide layer obtained via plasma vapor deposition procedures, at a thickness between about 10 to 500 Angstroms. Capacitor dielectric layer 17, can also be an oxidized silicon nitride on silicon oxide (ONO) layer, or an oxidized silicon nitride (NO) layer, both at an equivalent silicon oxide thickness between about 10 to 100 Angstroms. A polysilicon layer is next deposited via LPCVD procedures at a thickness between about 50 to 500 Angstroms, doped in situ during deposition via the addition of arsine, or phosphine, to a silane ambient. A photoresist shape, not shown in the drawings, is next used as an etch mask to allow an anisotropic RIE procedure, using $Cl_2$ or $SF_6$ as an etchant, to define polysilicon upper electrode shape 18, completing the fabrication of DRAM capacitor structure 19, comprised of overlying, polysilicon upper electrode structure 18, capacitor dielectric layer 17, and storage node structure 23, in turn featuring a necked profile needed to increase capacitor surface area.

While this invention has been particularly shown and described with reference to the preferred embodiments thereof, it will be understood by those skilled in the art that various changes in form and details may be made without departing from the spirit or scope of the invention.

What is claimed is:

1. A capacitor structure comprising:
   a storage node shape with a first portion of said storage node shape overlying a conductive via structure, wherein said conductive via structure is located in an opening in an insulator layer, and wherein said conductive via structure contacts a source/drain region of an underlying metal oxide semiconductor field effect transistor (MOSFET), and wherein a second portion of said storage node shape overlies portions of a top surface of said insulator layer; said storage node shape having alternate rows of doped regions therein that are aligned horizontally and parallel to the top surface of said insulator layer, and having alternate rows of undoped regions therein that are also aligned horizontally and parallel to the top surface of said insulator layer, with each set of said doped regions separated by a respective one of said undoped regions; said storage node shape further having lateral grooves extending inwards from sides of each said doped region in said storage node shape, and wherein each said undoped region of said storage node shape exhibits smooth, non-groove sides;
   a capacitor dielectric layer located on a smooth top surface of, and on sides of said storage node shape, and wherein said capacitor dielectric layer conforms to contours of the surfaces of the lateral grooves in each said doped region of said storage node shape; and
   a conductive upper node structure located over said capacitor dielectric layer.

2. The capacitor structure of claim 1, wherein said storage node shape is comprised of polysilicon.

3. The capacitor structure of claim 1, wherein the number of said alternate rows of doped regions is between about 3 to 10.

4. The capacitor structure of claim 1, wherein each doped region is doped with arsenic or phosphorous ions.

5. The capacitor structure of claim 1, wherein the space between said doped regions, or the width of each said undoped region, is between about 100 to 5000 Angstroms.

6. The capacitor structure of claim 1, wherein each said lateral groove in each said doped region extends inward from the sides of said storage node structure a distance between about 50 to 500 Angstroms.

7. The capacitor structure of claim 1, wherein said capacitor dielectric layer is comprised of tantalum oxide, at a thickness between about 10 to 500 Angstroms.

8. The capacitor structure of claim 1, wherein said conductive upper node structure is comprised of polysilicon.

* * * * *